United States Patent [19]

Levine

[11] Patent Number: 4,608,606
[45] Date of Patent: Aug. 26, 1986

[54] CCD FLOATING-ELEMENT OUTPUT STAGES PROVIDING LOW RESET NOISE WITH SINGLE SAMPLING

[75] Inventor: Peter A. Levine, West Windsor Township, Mercer County, N.J.

[73] Assignee: RCA Corporation, Princeton, N.J.

[21] Appl. No.: 815,662

[22] Filed: Dec. 30, 1985

Related U.S. Application Data

[63] Continuation of Ser. No. 590,044, Mar. 15, 1984.

[51] Int. Cl.$^4$ ............................................. H04N 5/34
[52] U.S. Cl. ................................... 358/213; 329/50
[58] Field of Search ............................. 358/212, 213; 357/24 LR; 329/50, 102, 109

[56] References Cited

U.S. PATENT DOCUMENTS

| | | | |
|---|---|---|---|
| 4,283,742 | 8/1981 | Izumita et al. | 358/213 |
| 4,330,753 | 5/1982 | Davy | 329/50 |
| 4,389,674 | 6/1983 | Hitt et al. | 358/213 |
| 4,435,730 | 3/1984 | Bendell et al. | 358/213 |
| 4,470,676 | 9/1984 | Kinoshita et al. | 358/213 |
| 4,496,982 | 1/1985 | Levine | 358/213 |
| 4,511,804 | 4/1985 | Ozawa | 358/213 |
| 4,514,765 | 4/1985 | Miyata et al. | 358/213 |

Primary Examiner—Gene Z. Rubinson
Assistant Examiner—L. C. Schroeder
Attorney, Agent, or Firm—Eugene M. Whitacre; Peter M. Emanuel; Lawrence C. Edelman

[57] ABSTRACT

The output signal from the CCD output register of a semiconductor imager having a floating-gate or floating-diffusion type of output stage is applied to a differentiation circuit. The response of the differentiator circuit to the introduction of charge under the floating element is synchronously detected at output register clock rate to obtain video samples with low reset noise. This is a single sampling process, which avoids the double sampling required in correlated double sampling to reduce reset noise, and which can provide for horizontal peaking.

11 Claims, 3 Drawing Figures

CCD FLOATING-ELEMENT OUTPUT STAGES PROVIDING LOW RESET NOISE WITH SINGLE SAMPLING

This is a continuation of application Ser. No. 590,044, filed Mar. 15, 1984.

The present invention relates to reducing in the reset noise accompanying signals from a charge transfer device with a floating diffusion or floating gate output stage, such as a charge-coupled device (CCD) imager, while avoiding double sampling.

BACKGROUND OF THE INVENTION (In describing a charge transfer device this application will use the convention of considering the surface of a semiconductor substrate on which the gate electrodes of the charge transfer device are disposed as its "top" surface, regardless of the actual orientation of the device in space; words such as "under" and "over" will be in accordance with this convention.)

Typically, a floating diffusion output stage incorporates a metal-insulator-semiconductor field effect transistor (MISFET) connected with gate electrode to the floating diffusion and operated in common-drain (or, alternatively, common-source) configuration as an electrometer to measure the potential on the floating diffusion. This potential is indicative of charge in a potential well "under" the floating diffusion. The measurement of potential is at signal-sampling intervals having reset intervals interspersed amongst them during which the floating diffusion is clamped by MISFET action to the reference potential at a reset drain. More particularly, the floating diffusion is a virtual source in this MISFET action, occuring responsive to potential applied to a reset gate electrode between the floating diffusion and reset drain. It is standard practice to interpose a gate electrode between the floating diffusion and the reset electrode and to apply direct potential to this gate electrode so interposed, this being done to prevent potential responses to the reset pulses from appearing on the floating diffusion owing to electrostatic induction.

The resetting process of periodically clamping the floating diffusion to the potential at the reset drain is undesirably accompanied by a type of noise called "reset" noise. Reset noise arises as variations in the potential left upon the floating diffusion from one reset interval to another. (Reset noise is a problem with charge transfer devices having floating-gate output stages, as well as ones with floating-diffusion output stages.) Reset noise is the predominant noise in the upper-video frequencies of the output signals of charge transfer devices such as CCD imagers, typically being about 8 dB larger than noise in the MISFET electrometer stage following the floating diffusion. At lower video frequencies flicker or "1/f" noise arising in the MISFET electrometer stage predominates.

It is common practice to supply the imager output signals to a sample-and-hold circuit, which samples during the sample intervals in the imager output signal and then holds the samples through the intervals between samples. The response of the sample and hold circuit has increased baseband (or first harmonic spectral) content and decreased higher harmonic spectral content, as opposed to the imager output signal it receives. The duty factors of the imager output signal and of noise admixed during subsequent amplification processes are made alike through sampling and holding, so signal-to-noise does not suffer as greatly during such amplification. This procedure is denominated "single sampling" in this disclosure.

The desire to reduce both flicker and reset noise has led to the practice of correlated double sampling. In this procedure, in each CCD imager output register, clocking cycle, the signal on the floating diffusion is sampled, a first time when charge dependent upon reset noise but not upon signal is present in the potential well induced "under" the floating diffusion. The signal is then sampled a second time when charge dependent upon both that reset noise and upon signal is present there. Each pair of samples is then differentially combined to generate samples dependent substantially only on signal, with reset noise being suppressed. Correlated double sampling becomes less practical as the sampling rate of the charge transfer device output stage increases. Pulse widths become narrower, and pulse spacing is lessened towards the limit allowed by the time for charge equilibration under the floating-diffusion or floating-gate output. As output register clock rate rise to more than a few megahertz, the correlated double sampling technique becomes very difficult to employ. While with correlated double sampling 20 db noise reduction is obtainable at 100 kHz in the imager system the inventor has been working with, it is practically difficult to obtain more than three to six dB noise reduction at 1 MHz.

In U.S. Pat. No. 4,556,851 issued Dec. 3, 1985, entitled "REDUCTION OF NOIE IN SIGNAL FROM CHARGE TRANSFER DEVICES", and assigned to RCA Corporation, P. A. Levine (the inventor here too,) describes a solution to the reset noise problem, which avoids the need for double sampling. Rather than resetting the floating diffusion at the inut of the electrometer output stage to a drain potential using MISFET transistor action to provide hard clamping action, the floating diffusion is set to a potential in the charge transfer channel. While this technique has worked very well in laboratory testing with available CCD imagers, there is at present reluctance to rely on it in a commercial product, owing to lack of long-term experience with resetting to in-channel potentils. There is a fear that the technique may in some measure depend on imager device parametes in some yet undiscovered way. Accordingly, a solution to the reset noise problem has been sought, which solution is compatible with the resetting of the floating diffusion at the input of the electrometer output stage by hard clamp of the diffusion to reset drain potential.

It has been discovered by the present inventor that reset noise can be suppressed if the floating diffusion is reset to reset drain potential following each picture element sample being clocked to be "under" the diffusion for electrometer measurement. Furthermore, this can be achieved without needing to sample more than once during each pixel scan interval. Following reset there is an interval preceding the introduction of the next charge packet under the floating element of the electrometer CCD output stage. The reset noise level during this preceding interval is the same as the reset noise level during the easuing interval after introduction of charge and before subsequent reset. This phenomenon is exploited in correlated double sampling. Considering this phenomenon somewhat differently from the way it has been considered in the prior art, the transition in signal caused by introduction of a charge packet under the floating element is superposed on a reset noise pedestal that changes only from pixel-to-pixel. So, differentiation with respect to time of the CCD imager output signal will, in accordance with the present invention, suppress response to reset noise pedestals respective to response to the transitions caused by introduction of charge packets under the floating element. Synchronous detection of the differentially output signal can then take place over sampling periods extending over any fixed portion of the decaying response to these transitions, and the resulting output signal will exhibit good signal to reset noise ratio.

SUMMARY OF THE INVENTION

The present invention is embodied in a CCD imager, or its like, with a recurrently reset floating-element (e.g. floating-diffusion or floating-gate) output electrometer stage, followed by a differentation circuit and then by a synchronous detector. This synchronous detector implements a single sampling procedure, being operative to sample differentiation circuit responses to CCD output signal transients generated when charge packets are introduced under the floating element.

BRIEF DESCRIPTION OF THE DRWING

In the drawing:

FIG. 1 is a schematic diagram of the signal recovery system of the present invention, shown used with a CCD imager of the field transfer type; and FIG. 2 is a potential profile descriptive of resetting the floating diffusion to reset drain potential; and FIG. 3 is a timing diagram descriptive of the proper timing of resetting the floating diffusion to reset drain potential per FIG. 2.

DETAILED DESCRIPTION

Figure 1:
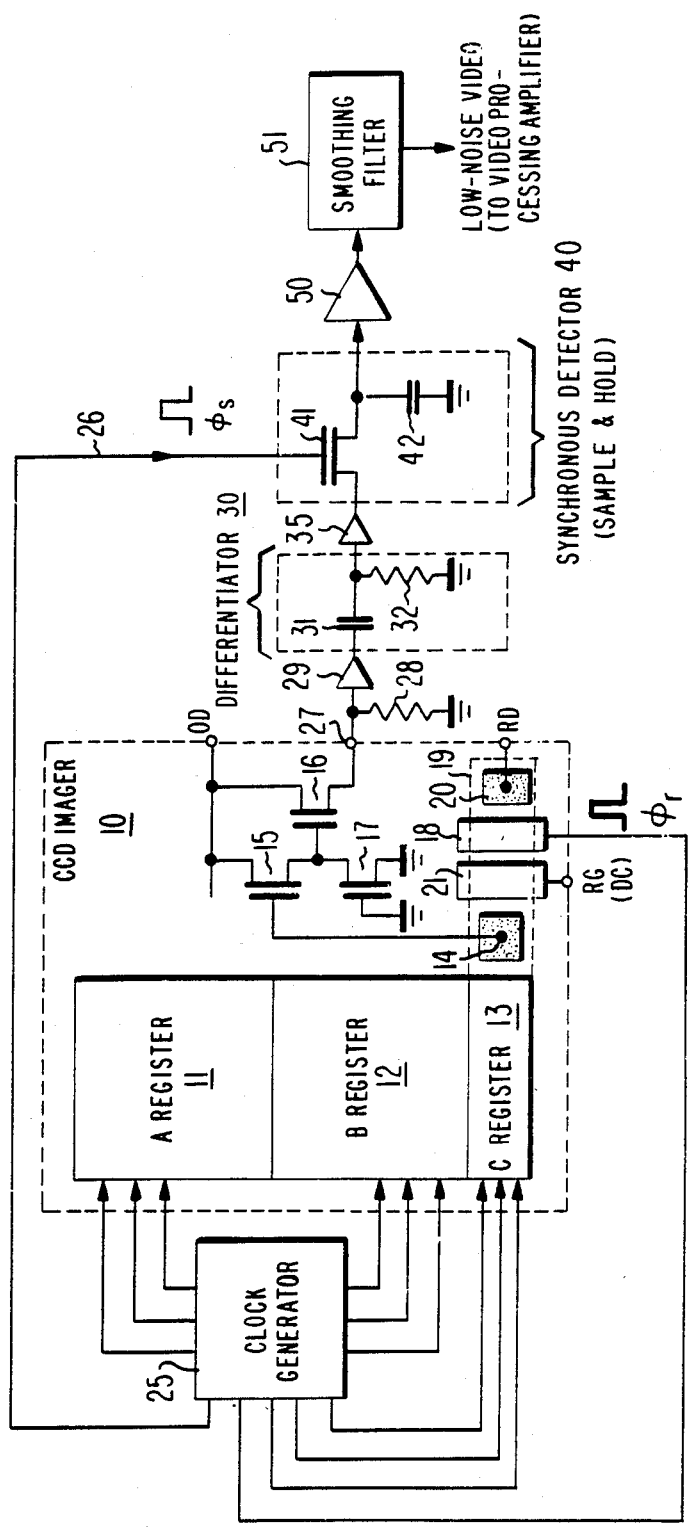

In FIG. 1 the signal recovery system of the invention is shown being used with a semiconductor imager which by way of example is a CCD imager 10 of field transfer type. CCD imager 10 includes per convention an image (or A) register 11, a field storage (or B) register 12, and a parallel-input-serial-output (or C) register 13. Output signal samples are generated from the charge packets transferred to the right end of C register 13, using a floating-diffusion type of charge-to-voltage conversion stage, by way of example. In such a conversion stage charge packets are regularly clocked forward from the output of C register 13 to a potential well disposed under floating diffusion 14, and the magnitude of charge in each packet is then determined by an electrometer comprising a cascade connection of source-follower metal-insulator-semiconductor field effect transistors 15 and 16. A further MISFET 17 is connected as a constant-current-generator source load for MISFET 15, and MISFET 16 is provided a source load by off-chip resistor 28 across which the CCD imager 10 output signal samples appear. A direct potential OD is applied to the drains of MISFET's 15 and 16 to condition them for source follower operation. The source of MISFET 16 connects to the output signal terminal 27 of CCD imager 10 and thence through an external source load resistor 28 to a ground connection.

Output signal samples supplied at the output terminal 27 of CCD imager 10 are applied to the input connection of a low-noise voltage amplifier 29. The output connection of amplifier 29 supplies input signal samples to a differentiator 30, buffering source-follower MISFET 16 from the loading of the input connection of differentiator 30. Amplifier 29 preferably has a bandwidth sufficiently restricted to roll off higher video frequencies somewhat. Then the subsequent differention with respect to time of video signal samples, which takes place in differentiator 30, responds to the signal transistions having lowered slew rate to generate pulses with greater energy content, and does not introduce into final video response excessive-amplitude spikes owing to clocking signal feedthrough. The differentiated-with-respect-to-time video response of differentiator 30 is supplied as input signal to a wide-band low-noise amplifier 35.

After each charge packet is measured, the potential on floating diffusion 14 as applied to the gate of MISFET 15 is reset responsive to a $\phi_r$ pulse applied to a reset gate 18. This pulse conventionally is somewhat narrower than the clocking pulse applied to the last clocked gate (not specifically shown) of C register 13 and can be disposed to occur within the time that clocking pulse appears. Reset gate 18 is disposed "over" a charge transfer channel 19 extending through the C register 13 and beyond to include floating diffusion 14 and a reset drain 20. More particularly, reset gate 18 is disposed "over" charge transfer channel 19 between floating diffusion 14 and reset drain 20 and is preceded by a d-c gate 21, to which gate 21 a direct potential RG is applied. D-C gate 21 is preferably a short gate to reduce the amount of stored charge thereunder and is used to prevent the $\phi_r$ pulses applied to reset gate 18 from electrostatically coupling to floating diffusion 14.

A clock generator 25 is shown in FIG. 1 supplying respective sets of three-phase clocking signals to A register 11, to B register 12 and to C register 13 as customary for a CCD imager of field transfer type. Other well-known clocking schemes using two-, four-, single- or virtual-phase clocking could be used instead. Clock generator 25 generates $\phi_r$ pulses as described above, for application to gate electrode 18 of the floating-diffusion output stage. Clock generator 25 also supplies $\phi_s$ pulses, at a repetition rate equal to the clocking frequency of C register 13 during serial line read-out, which $\phi_s$ pulses are applied via a line 26 to a synchronous detector 40. The $\phi_s$ pulses are used as carrier for controlling the times that signal supplied to synchronous detector 40 from the output connection of wide-band low-noise amplifier 35 is sampled in the synchronous detection process. Amplifier 35 provides voltage gain which raises signal level such that its accompanying noise is larger than that introduced by the synchronous detection process to follow; the noise attributable to amplifier 35 is with careful design negligible compared to the 1/f noise generated within CCD imager 10.

Differentiator 30 is shown in FIG. 1 as a simple RC high-pass filter comprising a series-arm capacitor 31 and a shunt-leg resistor 32. The RC time constant $\tau$ is chosen so at least as much of the baseband of the frequency spectrum of the CCD imager 10 output samples as are accompanied by flicker or "1/f" noise substantially large as compared to background thermal noise is suppressed in the output response of differentiator 30 supplied to synchronous detector 40. The time constant $\tau$ is the reciprocal of a corner frequency $f_c$, as expressed in radians per second, amplitude components at which frequency $f_c$ are suppressed 3 dB by filter 30. Frequency $f_c$ may be considered as a frequency of demarcation between substantial suppression and substantial non-suppression of frequencies present in the input signal of differentiator 30, but only selectively present in its output signal.

A 430 picofarad capacitor 31 and a 75-ohm resistor 32 has been used by the present inventor in a signal recovery system with 7.5 MHz C register 13 clocking frequency. The RC high-pass filter has a thirty-five nanosecond time constant, or $\tau$, providing for a 5 MHz corner frequency, so the upper frequencies of the baseband spectrum of the CCD imager 10 output samples combine with the demodulated first harmonic spectrum in synchronous detector 40 output signal to provide video high-frequency peaking. (The baseband signal remnants and the demodulated first-harmonic-spectrum signal are correlated and add algebraically, while the noise components from the respective bands are uncorrelated and add vectorially. So signal-to-noise advantages accrue with this form of video high-frequency peaking.)

One can use switching demodulators followed by low-pass filtering for synchronous detection in accordance with the invention. However, such synchronous detectors perform average detection, in which the recovered baseband is accompanied by strong harmonic spectra. It is preferable to use a synchronous detection process that is peak detection by nature to reduce the strength of the harmonic spectra remnant from detection process relative to the recovered base-band spectrum. A sample-and-hold circuit can perform as such a synchronous detector.

FIG. 1 shows a simple sample-and-hold circuit 40 comprising the selectively conductive channel of a MISFET 41 with which to sample and a capacitor 42 with which to hold the sample. The gate of MISFET 41 receives from line 26 the $\phi_s$ pulses supplied at a rate equal to C register clocking frequency, and its channel is selectively rendered conductive responsive to the $\phi_s$ pulses. MISFET 41 is operative, then, as a transmission gate of a type in which control signals ($\phi_s$ pulses from line 26) do not feed through to any appreciable extent to the selectively conductive channel. The output circuit of this form of synchronous detector is not balanced respective to input signals supplied to the selectively conductive channel. Baseband spectrum applied to the input of this synchronous detector appears at its output, which accommodates the video high-frequency peaking scheme referred to previously.

Detected output signal from sample-and-hold circuit 40, unlike that taken directly from a switching demodulator, is a usable video signal with no need for filtering beyond that afforded by video amplifier cut-off. Detected output signal is shown in FIG. 1 applied to a buffer amplifier 50 and thence to a smoothing filter 51. Filter 51 is preferably a low-pass filter that removes clocking frequency remnants so as to supply a low-noise video signal that is also free of aliasing on image details. This low-noise video will usually be directed to a video processing amplifier (not shown) where synchronizing and equalizing pulses will be inserted at times coordinated with the timing of clock generator 25.

The phasing of the pulses supplied via line 26 from clock generator 25 to the gate of MISFET 41 is arranged so the channel of that transistor is conductive during the decaying portions of differentiator 30 spike responses to the transition in CCD imager 10 output signal level attributable to the introduction of charge packets under floating diffusion 14. These transitions per se are not accompanied by reset noise, but there is remnant reset noise from the decaying portions of differentiator 30 spike responses to transitions in CCD imager 10 output signal at the leading and trailing edges of the $\phi_r$ reset pulses, which transitions do have reset noise components. (These arise respectively from the previous pixel, and from the current pixel, as will be treated in greater detail further on). Synchronous detection of the decaying portions of spike responses to the trailing edges of the $\phi_r$ can be reduced by arranging for a shorter RC time constant $\tau$ in differentiator 30, but this reduces the amount of horizontal peaking one can obtain from passing remnant baseband spectrum.

But, also avoiding synchronous detection of transitions at the leading and trailing edges of the $\phi_r$ pulses can be made easier by giving special attention to the timing with which $\phi_r$ reset pulses are applied to reset gate electrode 18 of the floating-diffusion CCD imager output stage. The intricacies of the reset procedure will be explained with the aid of potential profile diagram of FIG. 2 and the timing diagram of FIG. 3.

Figure 2:
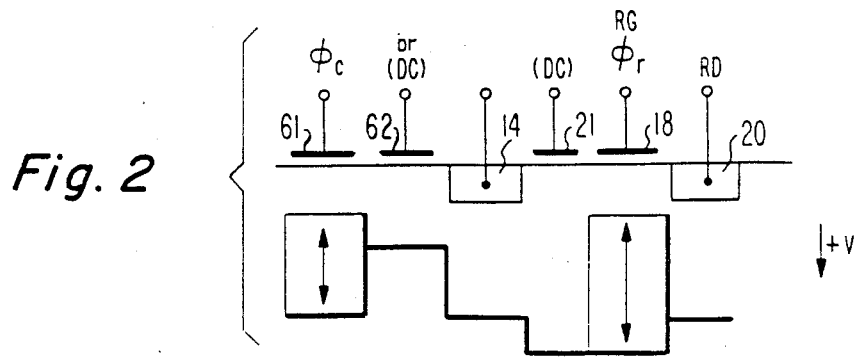

Per convention, the FIG. 2 potential profile diagram at its top has stylized representations of the structures encountered by charge packets moving from left to right in the charge transfer channel, and more positive potentials will be more downward in the diagram. The diagram will assume empty potential well under floating diffusion 14; and fringing field effects will for sake of simplicity be ignored, not being essential to understanding operation of the invention.

FIG. 2 potential profile diagram is descriptive of resetting floating diffusion 14 to reset drain potential RD applied to reset drain 20. $\phi_c$ is the phase of C register clocking applied during line read-out to the last clocked gate 61 of C register 13. C register 13 has a final gate 62 following clocked gate 61, to which final gate a direct potential BP is applied. BP establishes a barrier height to block the passage of charge from a potential well under clocked gate 61 to a potential well under floating diffusion 14 except when $\phi_c$ pulses gate 61 to less positive potential. Gate 21 has a potential RG applied to it such that the channel potential under gate 21 is as positive as, or more positive than, the drain potential RD. Fringing field effects will strongly affect the actual in-channel potential under gate 21, which is normally made very short to reduce charge sharing with the floating diffusion 14. $\phi_r$ ranges from a negative enough voltage during charge measurement time to erect an unsurmountable barrier for passage of charge from floating diffusion 14 to reset drain 20 diffusion to a positive enough voltage during reset time to allow the charge level under floating diffusion 14 to drain to RD potential as shown. Consequently floating diffusion 14 is reset to reset drain potential RD.

The RC time constant of the portion of the charge transfer in which floating diffusion 14 is disposed is very fast in this reset scheme, the C portion of the time constant being the very small capacitance to substrate of floating diffusion 14, and the R portion being the low resistance offered by the channel of the cascode field-effect-transistor action between floating diffusion 14 as source and reset drain 20 as drain when positive-going pulse $\phi_r$ is applied to rest gate 18. Resetting to the final value of thermal noise variations superposed on reset drain potential RD occurs because this time constant is too fast to integrate out the noise variations. This is a sample-and-hold process extending the duration of the last value of thermal noise variation until the next reset interval, thereby to create reset noise.

The inventor has found the method by which the reset noise can be reduced from a 100-electron or so level in operating the RCA Corporation 403-column CCD imager, reducing the reset noise to a level less than the 35-electron or so noise attributable to MISFET's 15, 16, 17. This method will be explained with the aid of FIG. 3.

Figure 3:
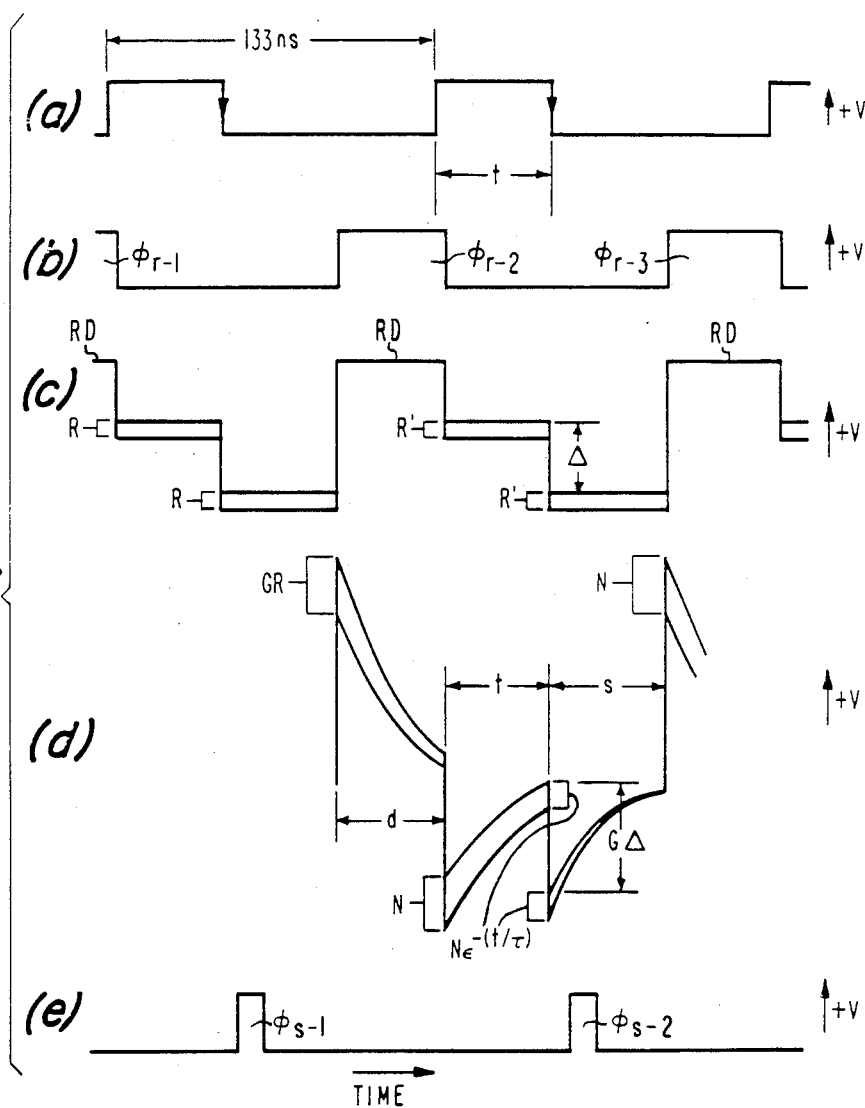

In FIG. 3 timing diagram waveform (a) is the clocking signal applied to the last clocked gate electrode 61 of C register 13, which last clocked gate electrode per conventional practice is immediately followed by a gate electrode 62 biased with direct potential, and is subsequently followed by the floating diffusion 14. For purposes of illustration three-phase clocking is assumed. The clock cycle is of 133 ns. duration in a 403-column-image-register CCD imager of field transfer type, operated to furnish a component of NTSC broadcast television signal. When the clock voltage applied to the last clocked gate electrode 61 of C register 13 goes negative, a charge packet sampling an image picture element is transferred under floating diffusion 14. This transfer is represented by an arrow on the voltage transition.

Waveform (b) of FIG. 3 illustrates the timing of the positive-going reset pulse $\phi_r$ applied to reset gate 18. An inital $\phi_r$ pulse $\phi_{r-1}$ is shown in wave form (b) followed by $\phi_r$ pulses $\phi_{r-2}$ and $\phi_{r-3}$; these pulses are in a succession of $\phi_r$ pulses. The $\phi_r$ reset pulse conventionally is applied shortly before the negative-going transition in waveform (a) when correlated double sampling is not used. However, here in waveform (b), the $\phi_r$ reset pulse is applied well before the negative-going transition, a length of time t at least not appreciably shorter than $\tau$, the RC time constant $\tau$ of capacitor 31 and resistor 32 forming differentiator 30. This allows the spike response of differentiator 30 to transitions generated at leading and trailing edges of $\phi_r$ pulses to be substantially completed at the time a $\phi_s$ pulse renders the channel of MISFET 41 conductive to sample the spike response of differentiator 30 to the transition associated with introduction of a charge packet under floating diffusion 14. Such earlier locations in time of $\phi_r$ reset pulses is used in operation with correlated double sampling as well, but for different reasons than in the present invention.

FIG. 3 waveform (c) shows the resulting potential variation on floating diffusion 14, which also appears, perhaps translated in direct bias level, at the source electrode of MISFET 16 and across the load resistor 28 of the CCD imager 10. Negative-going signal voltage is white-going. A range of variation, R, attributable to reset noise, appears in unclamped portions of waveform (c) between the reset pulses $\phi_{r-1}$ and $\phi_{r-2}$ shown in waveform (b).

A range of variation R', also attributable to reset noise, appears in portions of waveform (c) occurring during the time between the reset pulses $\phi_{r-2}$ and $\phi_{r-3}$ shown in waveform (b). The ranges of variation R and R' are of similar amplitude, but the amplitude variations in these ranges are not correlated. The introduction of a charge packet under floating diffusion 14 following the reset pulse $\phi_{r-2}$ creates a sample height $\Delta$ on which reset noise in the R' range is superposed.

FIG. 3 waveform (d) is an idealization of the voltage samples appearing at the output of amplifier 35 following differentiator 30. Clocking noise is not considered. The differentiator 30 suppresses low frequency content in its response, which response will be analyzed by superposition of responses to transition edges. The differentiation of the transition of waveform (c) at the leading edge of the reset pulse $\phi_{-2}$, as accompanied by reset noise of range R and amplified by the voltage gain G of amplifier 35, causes an initial value of GR in the range of reset noise appearing in waveform (d) during the $\phi_{r-2}$ pulse. This initial value of GR decays exponentially to GR $\exp^{-1}(d\tau^{-1})$ during the duration d of $\phi_{r-2}$ pulse. The differentiation of the transition of waveform (c) at the trailing edge of the $\phi_{r-2}$ pulse, as accompanied by reset noise of range R' and amplified by the voltage gain G of amplifier 35, increments GR $\exp^{-1}(d\tau^{-1})$ by non-correlated reset noise GR' to give an initial value N for the exponentially decaying range of total reset noise in the period between $\phi_{r-2}$ and $\phi_{r-3}$ pulses. These non-correlated reset noise components add such that N on average substantially equals $G[R'^2 + R^2 \exp^{-2}(d\tau^{-1})]^{(\frac{1}{2})}$ at the trailing edge of the $\phi_{r-2}$ pulse.

At a time t duration later, when a charge packet is introduced under floating diffusion 14, reset noise will be reduced to a value N $[\exp^{-1}(t\tau^{-1})]$. At this time the response of voltage amplifier 35 to differentiated $\Delta$ sample height has a value of G$\Delta$. Signal-to-noise ratio at this time has a value, then, of $\Delta[R'^2 + R^2 \exp^{-2}(d\tau^{-1})]^{-(\frac{1}{2})} \exp(t\tau^{-1})$. Since both G$\Delta$ sample and N/[exp $(t\tau^{-1})$] reset noise decay exponentially, this signal-to-noise ratio remains substantially constant as the G$\Delta$ sample decays.

FIG. 3 waveform (e) shows a representative phasing of two ($\phi_{s-1}$ and $\phi_{s-2}$) of the succession of $\phi_s$ sampling pulses applied via line 26 to the gate electrode of the n-channel MISFET 41 used as the sample switch in synchronous detector 40. Although circuit 40 is characterized as being sample-and-hold in nature, it is more accurately characterized as being track-and-hold in nature, with the last value of each sample being held throughout the ensuing hold period. The amplitude of sample-and-hold circuit 40 output response is greater, then, if sampling is done with a narrower pulse sooner after the G$\Delta$ negative transition.

Since the component of reset noise owing to the previous pixel, which is introduced at the leading edge of the $\phi_r$ pulse, and the component of reset noise owing to the current pixel, which is introduced at the trailing edge of the $\phi_r$ pulse, are not correlated and tend to be on average the same amplitude, shortening d as much as possible for given value of d+t tends to favor reduced reset noise. Making d to be 33 nanoseconds and t to be 40 nanoseconds, as compared to the 35 nanosecond time constant $\tau$ of filter 30, reduces reset noise by a factor of three compared to resetting just before admission of charge under floating diffusion 14. In the operation of the circuit specifically described using the RCA Corporation 403-column CCD imager, this reduction factor reduces reset noise to be less than the 35-electron amplifier noise.

As noted above, reset noise results when the reset of floating diffusion 14 is by hard clamp to reset drain 20, by reason of the attendant short RC time constant on the voltage appearing at floating diffusion 14 allowing reset to thermal noise. Reset noise may also be lowered by taking measures to lengthen the RC time constant on the floating diffusion 14. This can be done by resetting the floating diffusion, not to reset drain potential, but to an in-channel potential. Such resetting introduces an accumulation process providing time integration of the charge under the floating diffusion 14, which lengthens the effective RC time constant associated with floating diffusion 14. These alternative modes of resetting described in the above-noted U.S. Pat. No. 4,556,491 may be used in conjunction with the technique described in this disclosure. Other differentiator circuits than the resistor 31, capacitor 32 high-pass RC network can be used to implement the invention, of course.

The extension of the decaying response to the leading edges of reset pulses to overlap the response to the measurement of the ensuing pixel sample has a pronounced effect on video peaking (in line scan direction) of the synchronously detected CCD imager output signal. This will b explained with the aid of FIG. 3(d).

The loss of d-c baseline reference during passage of the CCD imager 10 output signal through differentiator 30 cooperates with the lack of d-c restoration except during line retrace to produce the following effect. The tail of the decaying exponential response to the leading edge of each reset pulse has an amplitude component that depends to on the value of the image sample admitted under floating diffusion 14 prior to that reset pulse. The lower frequency components of that previous image sample are similar to that of the next image sample admitted under floating diffusion 14 after that reset pulse, so the positive decaying exponential response to the leading edge of the reset pulse opposes the negative decaying exponential response to that next image sample. This reduces the lower-frequency modulation of each harmonic of C register clocking frequency in imager 10 output signal. Higher frequency components of the two image samples are dissimilar and the cancellation effect less pronounced. This increases the amplitude of higher-modulating-frequency sidebands of the harmonics of C register clocking frequency relative to the amplitude of their lower-modulating-frequency sidebands.

The factor by which the synchronous detector 40 output signal is peaked at each frequency is substantially constant despite variations in reset pulse amplitude or in the difference between amplitudes of successive pixel samples. The amount of peaking depends primarily on the degree to which the tail of the exponentially decaying positive response to difference of successive pixel samples is reduced in its overlap with the exponentially decaying negative response to the later pixel sample. The amount the tail is reduced depends on the expired time between the leading edge of reset pulse and the admission of succeeding image sample charge under floating diffusion 14—that is, the sum (d+t) of the duration d of the reset pulse and the interval t between the trailing edge of the reset pulse and that admission of charge.

The duration d of the reset pulse can be chosen to provide flat video response at the output connection of synchronous detector 40 (or, for that matter, to provide rolled-off or peaked video response if one so desires). The length of interval t can be adjusted to a degree to affect peaking as well, but there are (as noted above) constraints on this adjustment imposed by the desire to avoid reset noise. One may select d,t, and τ so as to provide for over-peaked video response, then trim the video response a desired using a variable resistance inserted in series with the channel of MISFET 41 to introduce a varying degree of roll-off.

The use of differentiator 30 prior to synchronous detector 40 solves another problem encountered in CCD imagers. During the parallel transfer of charge packets from the B register 12 to the C register 13 there is a transient change in the substrate bias which causes a level shift in CCD imager to response that appears as an initially pronounced decaying overbrightness in the first few video samples clocked out of C register 13 in each line of video. This overbrightness "hook" at edge of picture decays at a slow enough rate pixel-to-pixel as to be suppressed substantially in toto in differentiator 30 response. A similar effect can be seen at the top of the displayed image resulting from the transfer from the A register to the B register occurring during the vertical retrace interval. This too is substantially reduced in toto by differentiator 30.

While the invention has been described in connection with a field transfer type of CCD imager, 10, it is equally useful in other types of CCD images such s those of interline-transfer or line-transfer types. Indeed the invention is useful in other types of CCD devices using recurrently reset floating-element output stages where reduction of reset noise is of concern. This should be borne in mind when construing the scope of the following claims.

What is claimed is:

1. In combination:
   a charge coupled device operable as a shift register having
   a charge transfer channel,
   a succession of clocked gate electrodes across said charge transfer channel,
   a floating element for sensing charge in a portion of sid charge transfer channel following said succession of clocked gate electrodes,
   an electrometer stage having said floating element at an input connection thereof and supplying with attendant flicker noise output signal samples at an output connection thereof responsive to the charge sensed by said floating element,
   means responsive to reset pulses for clamping said floating element to a prescribed potential for the duration of each reset pulse,
   a drain in said charge transfer channel following said floating element, and
   means for introducing charge packets under selected ones of said clocked gate electrodes;
   means for applying clocking signals to said clocked gate electrodes at a clocking frequency, or rate, in appropriate phases to transfer charge packets through said charge transfer channel towards said drain following said floating element;
   a differentiation with respect to time circuit having an input connection from the output connection of said electrometer stage and having an output connection for supplying response to the output signal samples from said electrometer stage, in which response at least the lower frequencies of the baseband spectrum of output signal below a corner frequency are suppressed to reduce flicker noise arising in said electrometer stage;
   a synchronous detector having an input signal connection to the output connection of said differentiation circuit, having a carrier signal connection, and having an output connection from which synchronously detected signal is supplied;
   means for applying pulses at said clocking frequency to said carrier signal connection of said synchronous detector; and
   means for reducing reset noise in the synchronously detected signal which means includes
   means for applying reset pulses to said means for clamping, application being at times preceding each admission of charge under said floating element for sensing, which times are each substantially as long as the reciprocal of said corner frequency in radians per unit of time.

2. A combination as set forth in claim 1 wherein said floating element is a floating diffusion in said charge transfer channel, wherein said drain is connected to receive said prescribed potential to which said floating element is at times clamped, and wherein a reset gate electrode receptive of said reset pulses is disposed across said charge transfer channel and between said floating diffusion and said drain.

3. A combination as set forth in claim 1 wherein said differentiation with respect to time circuit has a time constant that is an appreciable portion of the time between successive admissions of charge under said floating element, for sensing; and wherein the high frequencies of said synchronously detected signal are peaked at least sufficiently not to exhibit roll-off by a method comprising the step of sufficiently reducing the time between the leading edge of each said reset pulses and the next admission of charge under said floating element for sensing.

4. In combination:
a CCD imager having a CCD output register through which charge packets descriptive of image pixels are transferred a line at a time at a pixel clocking frequency, having a floating-element output stage following said CCD output register for generating successive video signal samples responsive to corresponding successive charge packets and having means for resetting the floating element of said floating-element output stage subsequent to the generation of each successive video signal sample;

a high-pass filter, having an input circuit to which said successive video samples generated by said floating element output stage are applied, and having an output circuit for supplying response to those portions of said successive video samples falling into a frequency spectrum above a corner frequency $f_c$, which frequency $f_c$ is above the frequency where flicker noise is appreciable and below said pixel clocking frequency;

means, included within said means for resetting the floating element, for resetting the floating element to a fixed potential at a time before each charge packet is next introduced into said floating element output stage, which time is at least not appreciably shorter than the reciprocal of said corner frequency in radians per unit of time; and means synchronously detecting at said pixel clocking frequency the response supplied at the output circuit of said high pass filter, for providing a synchronously detected signal.

5. A combination as set forth in claim 4 wherein said corner frequency $f_c$ is less than one half pixel clocking frequency to peak video signal response in the direction of line scan.

6. A combination as set forth in claim 5 wherein said CCD imager is of a type having a CCD output register into respective stages of which charge packets are loaded in parallel, giving rise to undesirable level shifts accompanying earlier ones of these charge packets subsequently serially transferred to said floating-element output stage, and consequently generating in said floating element output stage undesirable transient response; and wherein said corner frequency $f_c$ is chosen sufficiently high to suppress response in said synchronously detected signal to said undesirable transient response of said floating-element output stage.

7. A combination as set forth in claim 5 wherein said CCD imager is of a type having a CCD field storage register into which charge packets descriptive of image samples are recurrently transferred, and having a CCD output register into respective stages of which charge packets are parallelly loaded a line at a time from said field storage register, the parallelly loaded charge packets of which CCD output register subsequently are serially transferred to said floating element output stage, said recurrent transfer of charge packets into said CCD field storage register giving rise to undesirable level shifts accompanying earlier rows of parallelly loaded charge packets, and consequently generating in said floating-element output stage undesirable level shifts in the response of said floating-element output stage during early lines of each field; and wherein said corner frequency $f_c$ is chosen sufficiently high to suppress response in said synchronously detected signal to said undesirable level shifts in the response of said floating-element output stage.

8. In combination:
a CCD imager supplying a series of spaced image response samples at a clocked rate, said series of spaced image response samples comprising a baseband frequency spectrum and harmonic frequency spectra;

a circuit for differentiating said image response samples to suppress at least the lower frequencies of said baseband frequency spectrum and their attendant flicker noise; and a sample-and-hold circuit sampling said differentiated image response samples at said clocked rate to provide an image response without spaces, said sample-and-hold circuit being operative as a synchronous detector for heterodyning one of said harmonic frequency spectra to baseband.

9. In combination:
a CCD imager supplying a series of spaced image response samples at a clocked rate said spaced image resonse samples comprising a baseband frequency spectrum and harmonic frequency spectra;

a filter for suppressing at least the lower frequency components of the baseband frequency spectrum of said series of spaced image response samples and thereby removing attendant flicker noise; and a sample-and-hold circuit sampling the output response of said filter to produce an output signal, being operative to heterodyne a non-suppressed harmonic spectrum of said series of spaced image response samples to baseband for providing the entire low-frequency content of said output signal.

10. A combination as set forth in claim 9 wherein said filter is a high-pass filter.

11. A combination as set forth in claim 10 wherein said high-pass filter includes a series arm capacitor and a shunt leg resistor.

* * * * *